United States Patent [19]

Yamaguchi et al.

[11] Patent Number: 5,047,768
[45] Date of Patent: Sep. 10, 1991

[54] DATA COMPANDING METHOD AND DATA COMPRESSOR/EXPANDER

[75] Inventors: Susumu Yamaguchi, Moriguchi; Tetsuo Ishiwata, Suita, all of Japan

[73] Assignee: Matsushita Electric Industrial Co., Ltd., Osaka, Japan

[21] Appl. No.: 514,835

[22] Filed: Apr. 26, 1990

[30] Foreign Application Priority Data

Apr. 27, 1989 [JP] Japan .................................. 1-108853
Nov. 14, 1989 [JP] Japan .................................. 1-295856

[51] Int. Cl.$^5$ .......................................... H03M 7/50
[52] U.S. Cl. .......................................... 341/95; 341/95
[58] Field of Search ...................... 381/29, 31; 341/50, 341/85, 87, 95, 106, 75, 139, 143; 84/603

[56] References Cited

U.S. PATENT DOCUMENTS

| | | |
|---|---|---|
| 3,825,924 | 7/1974 | Montgomery. |
| 4,433,604 | 2/1984 | Ott .................................. 84/603 |
| 4,626,829 | 12/1986 | Hauck .................................. 341/87 |
| 4,630,030 | 12/1986 | Roy .................................. 341/95 |
| 4,701,745 | 10/1987 | Waterworth .......................... 341/95 |
| 4,872,009 | 10/1989 | Tsukiyama et al. .................. 341/95 |
| 4,881,075 | 11/1989 | Weng .................................. 341/87 |
| 4,882,754 | 11/1989 | Weaver et al. ....................... 341/95 |
| 4,897,653 | 1/1990 | Wakumura et al. .................. 341/95 |
| 4,929,946 | 5/1990 | O'Brien et al. ....................... 341/95 |

FOREIGN PATENT DOCUMENTS

EP0063485A3 4/1982 European Pat. Off..
EP0102608A3 8/1983 European Pat. Off..

OTHER PUBLICATIONS

Journal of the Institute of Television Engineers of Japan, vol. 37, No. 11, Nov. 1983, pp. 935-941, JP; Yoshino et al.: "Digital Sound Transmission System for Television Broadcasting via Satellite".

Primary Examiner—William M. Shoop, Jr.
Assistant Examiner—Helen Kim
Attorney, Agent, or Firm—Wenderoth, Lind & Ponack

[57] ABSTRACT

A data companding method instantaneously compands the 14-bit digital audio signals to be outputted from a satellite broadcast receiver and so on is realized with the given conversion rule, which has a superior companding characteristics across the whole input range of the 14-bit data with SN being not deteriorated as compared with the 14-10 near-instantaneous companding law at the satellite broadcast transmission. A data compressor and a data expander in accordance with the present invention are realized by the construction of the combination of the coefficient table, a data shifter composed of a pluarlity of 4 to 1 data selectors, and an adder.

8 Claims, 7 Drawing Sheets

Data Compressor

Note: (A) shows the value of A upon omitting the amount of less than a decimal point.

Fig. 5

| | 14 bits digital input (X) | | 12 bits digital output (Y) |
|---|---|---|---|
| IV | 8191 ~ 4096 | $Y = 1536 + \left(\dfrac{X-4096}{8}\right)$ | 2047 ~ 1536 |
| III | 4095 ~ 1024 | $Y = 768 + \left(\dfrac{X-1024}{4}\right)$ | 1535 ~ 768 |
| II | 1023 ~ 512 | $Y = 512 + \left(\dfrac{X-512}{4}\right)$ | 767 ~ 512 |
| I | 511 ~ 0 | $Y = X$ | 511 ~ 0 |
| I' | -1 ~ -512 | $Y = X$ | -1 ~ -512 |
| II' | -513 ~ -1024 | $Y = -513 + \left(\dfrac{X+513}{2}\right)$ | -513 ~ -768 |
| III' | -1025 ~ -4096 | $Y = -769 + \left(\dfrac{X+1025}{4}\right)$ | -769 ~ -1536 |
| IV' | -4097 ~ -8192 | $Y = -1537 + \left(\dfrac{X+4097}{8}\right)$ | -1537 ~ -2048 |

Note: (A) shows the value of A upon omitting the amount of less than a decimal point.

Data Expander

DATA COMPANDING METHOD AND DATA COMPRESSOR/EXPANDER

BACKGROUND OF THE INVENTION

The present invention generally relates to a data companding method of recording and reproducing audio signals converted into digital signals, and to the configuration of a data compressor and a data expander which utilize the same companding method.

In recent years, the art of digitizing ;audio signals so as to effect broadcasting operations and recording and reproducing operations has advanced considerably. Digital audio broadcasting by a broadcast satellite is an example of the former operations. Also, the digital audio tape recorder (hereinafter referred to as DAT) is an example of the latter operations.

In the specification of the digital audio signals sent by satellite broadcasting, there is known as a broadcast A mode having a four-channel capacity of a standardized frequency of 32 KHz, and 14-10 near-instantaneous companding law), and a broadcast B mode having a two-channel capacity of 48 KHz and a 16-bit linear quantization in the satellite broadcasting in a case of the Japanese territory. (See the following cited literature: (1) Yoshino, Ohmi, Tsuji, Kawai: "Digital Sound Transmission System for Television Broadcasting via Satellite", The Journal of the Institute of Television Engineers of Japan, Vol 37, No. 11, PP935–941, Nov., 1983). Also, in the audio signal specification of the MAC system which is a satellite broadcasting arrangement Europe, in a standardized frequency of 32 KHz or 16 KHz, and a 14-bit linear quantization or a 14-10 bit near-instantaneous companding law variously combined are used. See the following cited literature: (2) "Specification of the system of the MAC/pocket family", PP. 85–130, EBU Technical Document 3258, Oct. 1986).

The recording modes of the audio signal specifications of the DAT (Digital Audio Tape recorder) are classified into a first mode of 48 KHz, 44.1 KHz and 32 KHz standardized frequency, 16-bit linear quantization, and two-channel capacity, and a second mode of 32 KHz standardized frequency, four-channel capacity and a 16-12 bit near-instantaneous companding law. (See the following cited literature: (3) THE DAT CONFERENCE STANDARD, "Digital Audio Tape recorder system" 1987, 6, The DAT Conference). In the recording of digital audio signals sent via a satellite broadcast by DAT, all the high-quality two-channel signals may be digitally recorded directly in the first mode of the DAT (in the case of standardized frequency of 48 KHz).

However, the signals exceeding the two channels, as in the satellite broadcast A mode, must be recorded, due to the restriction of the recording capacity, with the 14-bit data of the satellite broadcast output being data-compressed into 12 bits. Therefore, in the current DAT, the 16-12 instantaneous companding law is provided as a norm. The digital audio signals of the A mode may be recorded in the second mode (standardized frequency 32 KHz, 16-12 bit instantaneous companding law) of the DAT. However, the data of 14 bits is processed artificially as 16 bits. This is not necessarily optimal in that the 14-bit data is directly compressed into 12 bits.

As the 14-12 instantaneous companding law or the conventional example close to it, there is the 14-12 instantaneous companding law shown in the above described literature (1,) or the 13-11 instantaneous companding law shown in the following cited literature: (4) Okimi: "Transmission Techniques for Stereophonic Sound Signals", The Journal of the Institute of Television Engineers of Japan, Vol. 34, No. 4, PP322–327, Apr., 1980. In the example of the former, the vertical axis and the horizontal axis are made double in scale, with the example of the latter being provided as the basis as shown even in the same document, and the characteristic curve is similar.

As shown in the cited literature, by the use of the data companding operation, much data or information may be transmitted or recorded/reproduced with a small capacity, and the number of the channels may be increased. However, after the companding operation, a constant amount of deterioration is unavoidably caused by the signal to noise ratio (hereinafter referred to as an SN) or the like with respect to the original signal due to the data drop accompanied by the companding operation. Therefore, when the 14-12 instantaneous companding law, which is an optimal data compacting method, is taken into consideration so a to record the digital audio signal (standardized frequency; 32KHz quantization bit number; 14 bits) to be transmitted in the mode, it is important to take the following two points into consideration.

Firstly, the digital audio signals to be sent by satellite broadcasting (A mode) are companded in a 14-10 near-instantaneous operation within the transmission path of the satellite broadcasting. After it has been expanded into 14 bits by the satellite broadcasting receiver, it is sent into the recording/reproducing machine and is compressed into 12 bits again. Thus, the SN deterioration amount in a L case where it has been companded by the 14-12 instantaneous companding law must not exceed the deterioration amount in the case of the 14-10 near-instantaneous companding law.

Secondly, superior companding characteristics must be retained across all the ranges of the 14-bit digital input.

The above described conventional art satisfies the conditions on a first point, but is insufficient on a second point. Namely, in order to realize the superior 14-12 instantaneous companding characteristics, it is necessary to correspondingly provide in a given relationship with the 12-bit digital data throughout the entire range of the 14-bit digital data. However, in the above described conventional art, the range (the number of the stages in the quantization) of the 14-bit digital data provided correspondingly in a given relation with the 12-bit digital data is only the range of the (0–7679) in the positive side, for example, with the data between the remaining (7680–8191) retaining the greatest value of the 12-bit digital data. The data exceeding 7679 after the companding operation is in a clip condition. The signal which has been inputted into the range has a problem in that large distortion is caused by the compression, and expansion processings of the data.

Also, the data processing between (7680 through 8191) is different in regularity from the signal processing in the other regions, in the construction of the signal processing circuit of the compression/expansion. Thus, a magnitude comparator for exclusive use, a switch for retaining the greatest value of the 12-bit digital data, and so on are additionally required, with a problem, being that the hardware scale is increased.

SUMMARY OF THE INVENTION

Accordingly, an essential object of the present invention is to provide a data companding method with a superior companding characteristics being provided with respect to all the ranges of the 14-bit digital input, and the SN which is equal to or higher than the 14-10 near-instantaneous companding law being retained.

Another important object of the present invention is to provide a data compressor and a data expander for realizing the data companding method.

In accomplishing these and other objects, according to one preferred embodiment of the present invention, there is provided a data companding method comprising the steps of obtaining the general conditions wherein the 14-12 instantaneous companding law is materialized with respect to the entire range of the 14-bit digital data, adding the conditions where the SN deterioration amount by the data companding is made equal to or less than the 14-10 near-instantaneous companding, furthermore adding the conditions of the optimal level of the companding operation with respect to the audio signal in the actual use condition, favorable hardware construction and so on, so as to provide the instantaneous companding method for realizing the optimal 14-12 instantaneous companding operation.

Also, the data compressor of the present invention is composed of a coefficient table which is adapted to receive the 5 most significant bits (D9 through D13) with respect to the digital audio data (D0 through D13) quantized by 14 bits, and to output a two-bit signal (S0 through S1) showing the bit shift amount with respect to the digital audio signal, and to output an offset value (OFS0 through OFS11) to be added to the bit shifted data, a data shifter composed of twelve 4 to 1 data selectors for shifting in the least significant bit direction the digital audio data (D0 through D13) from the outputs (S0 through S1) of the coefficient table so as to output the resultant 12-bit data (SD0 through SD11), and an adder for adding the output signals (OFS0 through OFS11) of the coefficient table and the output signals (SD0 through SD11) of the data shifter.

Also, the data expander of the present invention is composed of a coefficient table which is adapted to receive the 5 most significant bits (D7 through D11) of the digital audio data with respect to the 12-bit digital audio data (D0 through D11) compressed by the data compressor, and to output a 2-bit signal showing the bit shift amount of the data and offset values (OFS0 through OFS11) to be added to the digital audio data (D0 through D11), an adder for adding the digital audio data (D0 through D11) and the output signals (OFS0 through OFS11) of the coefficient table, and a data shifter composed of 14 selectors of 4 to 1 data for shifting in the most significant bit direction the output signals (M0 through M11) of the adder by the outputs (S0 through S1) of the coefficient table.

According to the above described configuration the data companding method of the present invention retains the SN deterioration amount which is equal to and less than the 14-10 near-instantaneous companding law in the instantaneous companding operation of the 14-bit digital data into 12 bits, and realizes the superior data companding characteristics across the entire range of the 14-bit digital data. Therefore, the 14-bit digital data to be outputted by, for example, the satellite broadcasting receiver is compressed into 12 bits in the best condition, so that the recording, reproducing operations may be effected onto the medium with less data capacity.

Also, by the above described construction, the data compressor of the present invention divides into four amplitude ranges the 14-bit digital audio data in accordance with the conditions shown in the data companding method so as to determine the gradient of the compressed characteristics in the respective ranges, namely, the shift amount for shifting the 14-bit data in the least significant bit direction and the offset value to be added to the data after the bit shifting, so that the processing operation of the data compressor is realized.

Also, by the above described construction, the data expander of the present invention divides the 12-bit digital audio data into four amplitude ranges in accordance with the conditions shown in the data companding method so as to determine the offset value to be added to the digital audio data and the gradient of the expansion characteristics in the respective ranges, namely, the bit shift amount for shifting in the most significant bit direction of the data after the offset value addition, so that the processing operation of the data expander is realized.

BRIEF DESCRIPTION OF THE DRAWINGS

These and other objects and features of the present invention will become apparent from the following description taken in conjunction with the preferred embodiment thereof with reference to the accompanying drawings, in which;

FIG. 5 is a chart showing the conversion in the embodiment;

DETAILED DESCRIPTION OF THE INVENTION

Figure 1:
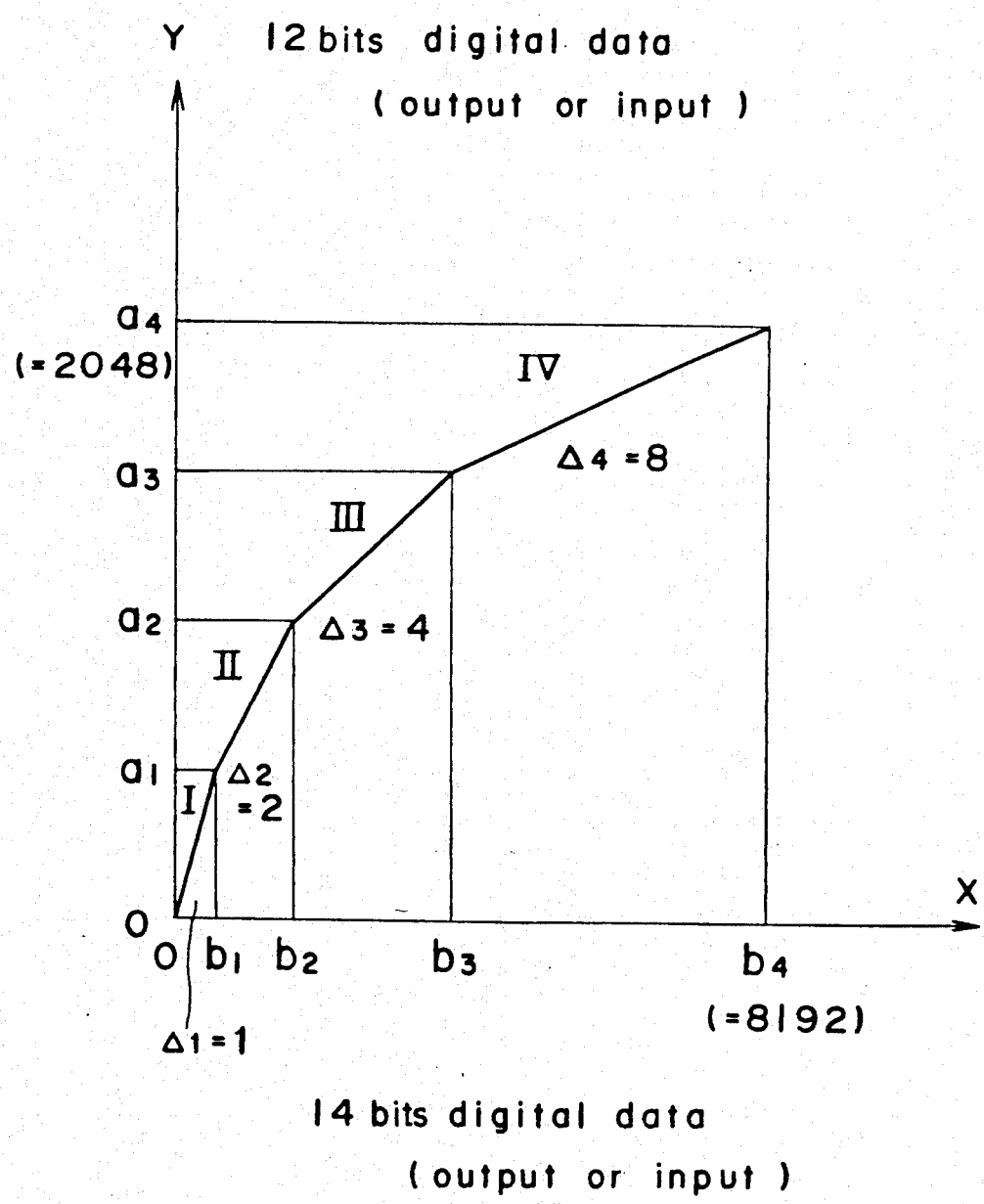
FIG. 1 is a characteristic chart showing the general construction of a data companding method.

Before the description of the present invention proceeds, it is to be noted that like parts are designated by like reference numerals throughout the accompanying drawings.

A data companding method, a data compressor, a and data expander according to the present invention will be described hereinafter with reference to the drawings.

FIG. 1 is a characteristic chart showing the generalized 14-12 instantaneous 7-segment companding laws. The instantaneous companding law is generalized by a 7-bent line construction. The general conditions where the companding law is materialized will be described. Referring to FIG. 1, the positive side only is shown for brevity, with the negative side being symmetrical.

As is clear from the chart, five points of the origin (0,0), (b1,a1), (b2,a2), (b3,a3), (b4,a4) are respectively connected, with the step sizes $\Delta i$ (i=1,2,3,4), namely, gradients 1, $\frac{1}{2}$, $\frac{1}{4}$, $\frac{1}{8}$ being straight lines.

Also, assume that the inputs and outputs are not discrete values, but are continuous values for simplification of the solution. In order to obtain the superior compression characteristics throughout the entire range of 14-bit digital data and 12-bit digital data, (b4,a4)=(8192,2048) is required. In order to realize the 14-12 instantaneous companding law, it may be determined from FIG. 1 that the realization of the following equation (A) is a necessary condition in terms of the remaining points such as b1, b2, b3. Namely, the following four equations are realized from the relationship of the gradients and the origins (0,0) through (a4,b4) of FIG. 1.

$$\frac{a1 - 0}{b1 - 0} = 1 \tag{1}$$

$$\frac{a2 - a1}{b2 - b1} = \frac{1}{2} \tag{2}$$

$$\frac{a3 - a2}{b3 - b2} = \frac{1}{4} \tag{3}$$

$$\frac{a4 - a3}{b4 - b3} = \frac{1}{8} \tag{4}$$

And the following equation (A) is obtained from the above equations (1) through (4).

$$4b1 + 2b2 + b3 = 2^{14-1} = 8192 \tag{A}$$

In order to obtain the SN ratio which is equal to and more than the 14-10 near-instantaneous companding law, the 14-12 instantaneous companding law requires that at least the least resolving power of the former should exceed the least resolving power of the latter. The least resolving power of the 14-10 near-instantaneous companding law is 10 bits. The value $b1 = 2^{10-1} = 512$ or more is selected as the value in the 14-12 instantaneous companding law equivalent to it, if the positive side only is taken into consideration.

The data companding method of the present invention may be guided by the simpler construction by the actual apparatus, the way of the optimal compression point with respect to the audio signal in the actual use condition, and so on.

The first embodiment of the data companding method of the present invention will be described hereinafter with reference to the drawings. It is to be noted that the input and output values to be handled hereinafter are the actual discrete values.

Figure 2:
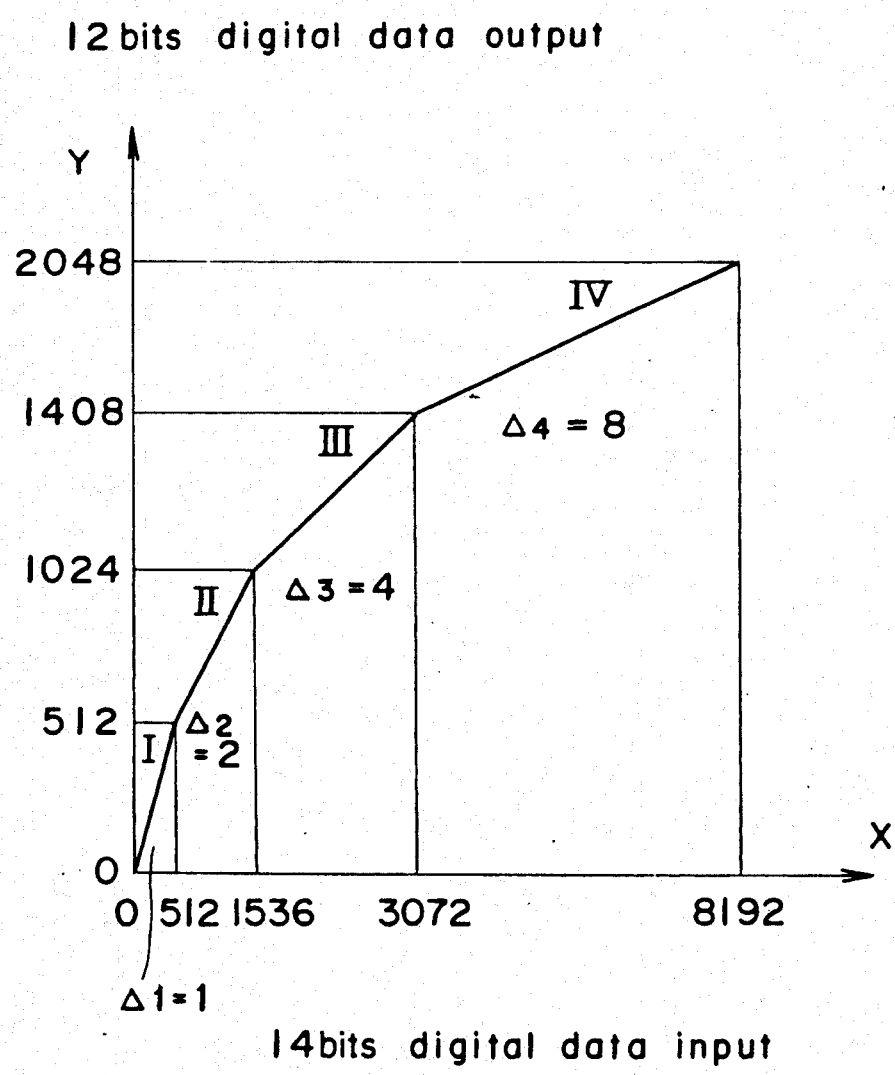
FIG. 2 is a performance characteristics chart showing a first embodiment in a data companding method of the present invention.

FIG. 2 is a performance characteristic chart of the first embodiment of the data companding method of the present invention. The SN ratio by the data companding operation selects b1=512 so as to be equal to the 14-10 near-instantaneous companding.

Referring to FIG. 2, the horizontal axis is the 14-bit digital data and the vertical axis is 12-bit digital data, with the positive side only being shown as in FIG. 1. The signal of the step between the bits 0-511 of the 14-bit digital data is allocated as it is to the step between the (0-511) of the 12-bit digital output (region I). Also, the signal of the step between the bits 512-1535 of the 14-bit digital data is compressed by the companding range ½ and is allocated to the step between the bits 512-1023 of the 12-bit digital data (region II). Likewise, the signal of the step between the bits 1536-3071 is compressed by the companding range ¼ and is allocated to the step between the bits 1024-1407 (region III). The signal of the step between the bits 3072-8191 is compressed by the companding range ⅛ and is allocated to the step between the bits 1408-2047 (region IV).

Figure 3:
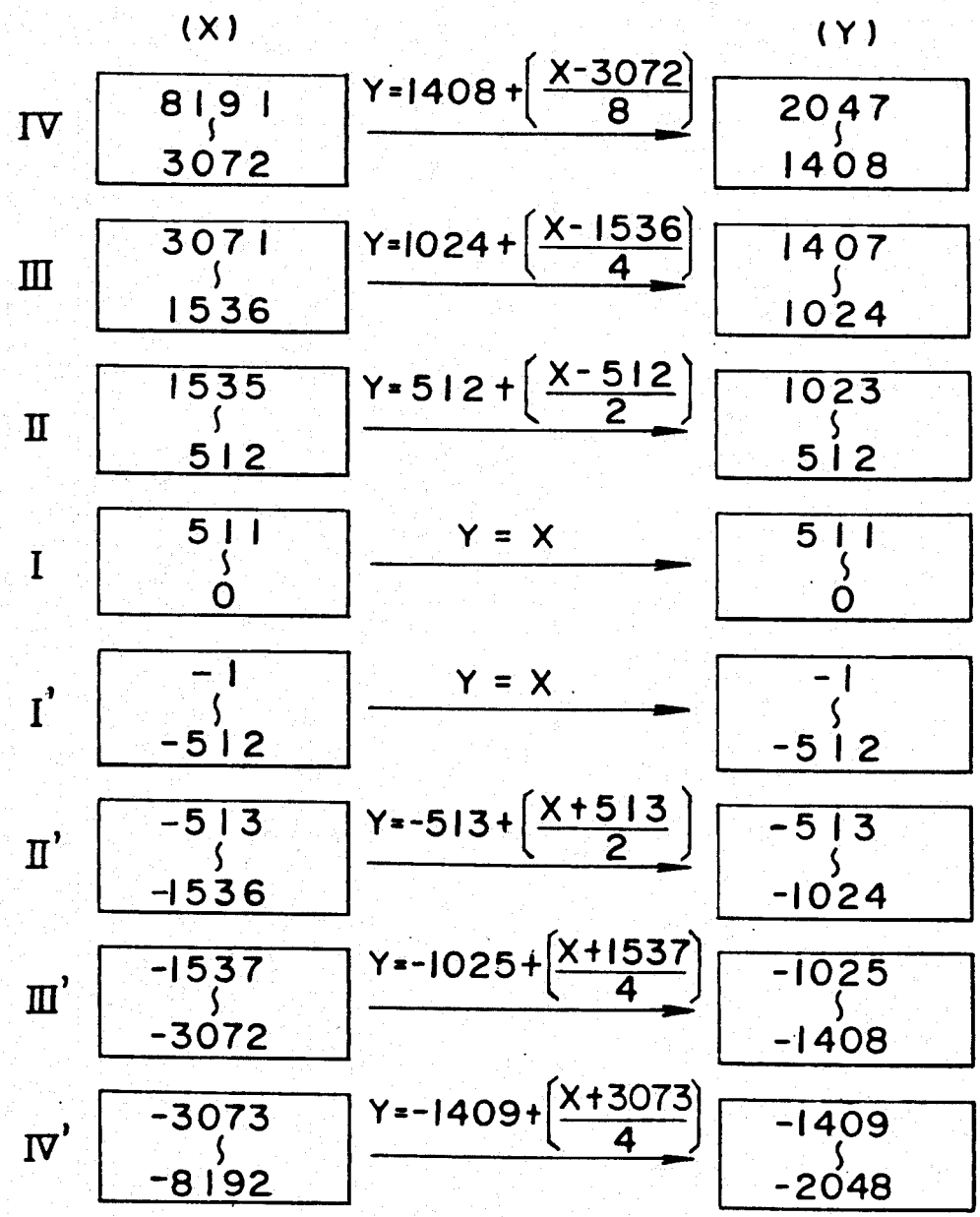
FIG. 3 is a chart showing the conversion in the same embodiment.

Only the positive side is shown in the above description. FIG. 3 shows a chart of the companding method in the above described first embodiment including the negative side.

In FIG. 3, the left term is the 14-bit digital data (X), the right term is the 12-bit digital data (Y), the values of each frame being allocated to both the right, and left terms by the center equation.

Also, the respective bent points of the companding characteristics are respectively −8.5 dB, −14.5 dB, −24 dB from the peak in the converted dynamic range of the audio signal, with almost equal companding characteristics being realized within the range.

As described hereinabove, according to the first embodiment of the data companding method of the present invention, the approximately equal companding characteristics with respect to entire input range of the 14-bit digital data are required and also, the ratio which is equal to the 14-10 near-instantaneous companding operation is realized.

The second embodiment of the data companding method of the present invention will be described hereinafter with reference to the drawings.

Figure 4:
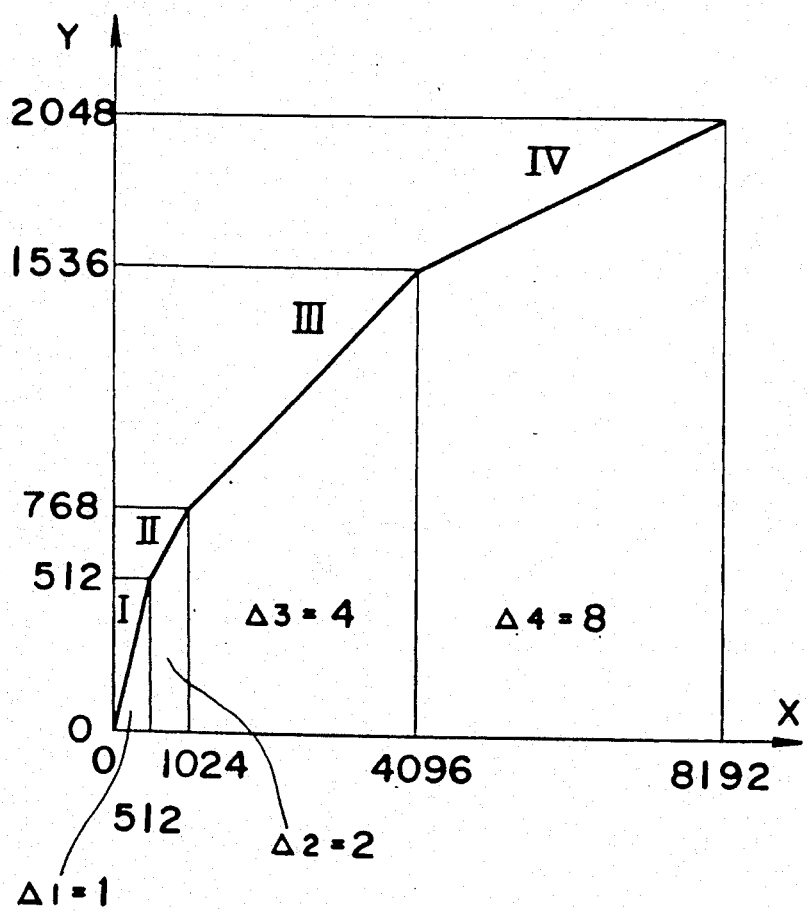
FIG. 4 is a performance characteristic chart showing a second embodiment in the data companding method of the present invention.

FIG. 4 shows the performance characteristics in the second embodiment of the data companding method of the present invention.

In order to make the SN ratio by the data companding operation equal to the 14-10 near-instantaneous companding as in the first embodiment, the value b1=512 is selected. The signal of the step between the bits 0-511 of the 14-bit digital data is allocated as it is to the step between the bits 0-511 of the 12-bit digital data by the companding range 1 (region I). The signal of the step between the bits 512-1023 is compressed by the companding range ½ and is allocated to the step between the bits 512-767 (region II). The signal of the step between the bits 1024-4095 is compressed by the compression range ¼ and is allocated to the step between the bits 768-1535 (region III). The signal of the step between the bits 4096-8191 is compressed by the companding range ⅛ and is allocated to the step between the bits 1536-2047 (region IV).

The conversion into the 12-bit digital data of the 14-bit digital data by the data companding method of the above described second embodiment including the positive side and the negative side as in the first embodiment is shown in FIG. 5.

According to FIG. 4, the bent points of the companding characteristics are respectively −6 dB, −18 dB, −24 dB in the converted dynamic range of the audio signal, the wider linear region being provided within the head room of the portion which is higher than the −18 dB which is the average record level of the normal audio signal.

According to the second embodiment of the data companding method of the present invention as described hereinabove, the superior companding characteristics are maintained with respect to the entire input range of the 14-bit digital data, and the equal SN region may be widely retained, especially in the region of the level higher than −18 dB which is the average record level of the normal audio signal, thus realizing the SN acquisition which is equal to the 14-10 near-instantaneous companding law.

In the first and second embodiments of the data companding method of the present invention, the data compressing method has been described in FIG. 3 and FIG. 5, and the data expanding method may be easily realized, needless to say, by the processing in inverse to the above described embodiment.

Although the present invention is described as a data companding method for recording the digital audio signal on a recording medium like, for example, DAT, the present invention may be used so as to effect broadcasting, communication, transmission and so on. Also, in the embodiment, the description is effected with the 14-12 instantaneous companding law being provided as a representative one. But as in the cited literature (1), and (4) in the conventional example, this may be, needless to say, applied to the 13-11 instantaneous companding law, and the other companding laws having the similar characteristics curves by changing the scale factor of the vertical axis and horizontal axis.

Then, a data compressor using the first embodiment of the data companding method of the present invention will be described hereinafter with reference to the drawings.

Figure 6:
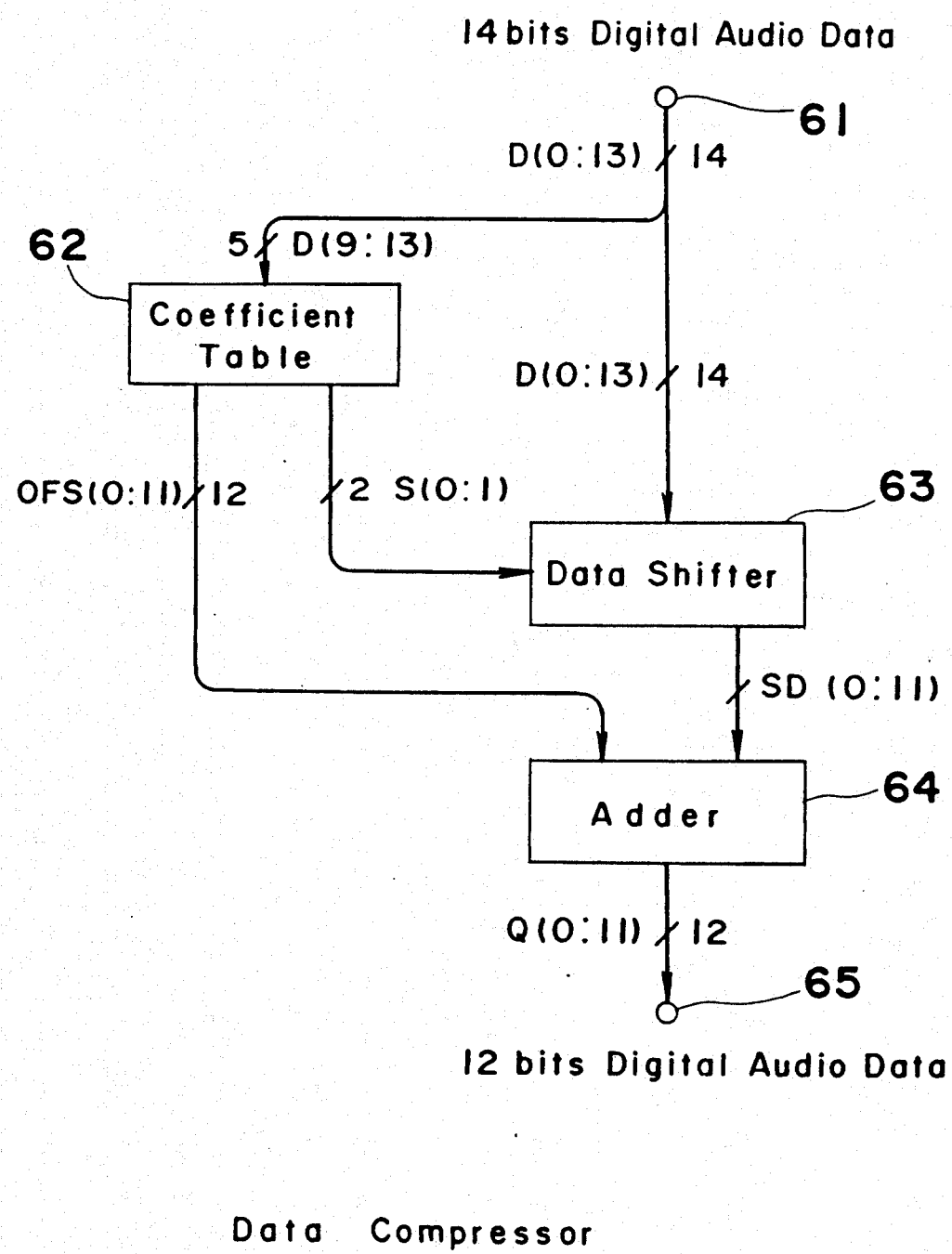
FIG. 6 is a block diagram showing the construction of the data compressor using the first embodiment of the data companding method of the present invention.

FIG. 6 is as block diagram showing the construction of one embodiment of the data compressor of the present invention. In the following description, the (A:B) denotes digital data composed of the (B-A+1) bits from the (A+1)th bit from Do to the (B+1)th bit with Do being a least significant bit (LSB), Dn being a most significant bit (MSB), with respect to the digital data of the (n+1) bit composed of the (Do, ..., Dn).

Referring to FIG. 6, reference numeral 61 is an input terminal of the digital audio data D (0:13) linearly quantized with 14 bits, reference numeral 62 is a coefficient table for decoding the most significant five bits D (9:13) of the D(0:13), reference numeral 63 is a data shifter composed of twelve 4 to 1 data selectors for shifting the D (0:13) in the direction of the least significant direction, reference numeral 64 is an adder for adding a 12-bit output signal SD (0.11) from the data shifter 63, an adder for adding the output OFS (0:11) from the coefficient table 62, and reference numeral 65 is an output terminal of digital audio data Q (0:11) which is adapted to depress the data to 12 bits outputted from the adder 64.

The operation of the data compressor of the present embodiment constructed as hereinabove will be described.

A conversion equation of the compression from 14 bits to 12 bits shown in FIG. 3 may be presented as follows in the respective regions if transformed.

```
IV  Y = [X/8] + 1024
III Y = [X/4] + 640
II  Y = [X/2] + 256
I   Y = X
I'  Y = X
II' Y = [X/2] − 256
III'Y = [X/4] − 640
IV' Y = [X/8] − 1024
``` wherein the [A] shows a valve truncation which has the decimal point or lower of the A value with the fractions being omitted.

As is clear from the above equations, the data compressor of the present embodiment can be realized by the operation of $\frac{1}{2}^n$ multiple with respect to the 14-bit digital data, namely, by the bit shift processing into the least significant bit direction and the adding operation of the offset value.

The digital audio data D (0:13) of the 14 bits inputted into the input terminal 61 decodes the most significant five bits D (9:13) at the coefficient table 62, judges a region where the input data is positioned in accordance with the above described equation so as to output a bit shift amount S (0:1) into the input data and the offset value OFS (0:11) to be added to the data after the shifting operation. The relationship between the S (0:1) and OFS (0:11) with respect to the D (9:13) will be shown in Table 1.

TABLE 1

| D (9:13) (Binary) | S (0:1) | OFS (0:11) (Hex) |
|---|---|---|
| 01111 through 00110 | 3 | 400 H |
| 00101 through 00011 | 2 | 280 H |
| 00010 through 00001 | 1 | 100 H |
| 00000 through 11111 | 0 | 000 H |
| 11110 through 11101 | 1 | F00 H |
| 11100 through 11010 | 2 | D80 H |
| 11001 through 10000 | 3 | C00 H |

The continuous 12-bit data is selected from the 14-bit digital audio data D (0:13) in accordance with the value of the bit shift amount S (0:1) by the data shifter 63 composed of the twelve 4 to 1 data selectors so as to effect the operation of $\frac{1}{2}^n$ by the bit shift. The adder 64 adds the offset value OFS (0:11) and the output SD (0:11) of the data shifter, the output signal Q (0:11) of the adder 64 becomes the data-compressed 12-bit data and is outputted from the output terminal 65.

As described hereinabove, the data compressor of the present embodiment divides the total range into four regions in accordance with the conditions where the 14-12 instantaneous companding is realized with respect to the entire input range of the 14-bit digital data by the coefficient table 62 so as becomes the data-compressed 12-bit data and is outputted from the output terminal 65.

As described hereinabove, the data compressor of the present embodiment divides the entire range into four regions in accordance with the conditions where the 14-12 instantaneous companding is realized with respect to the entire input range of the 14-bit digital data by the coefficient table 62 so as to add the gradient of the compression characteristics in the respective regions, namely, the shift amount for shifting the 14 bit data in the least significant direction, and the offset value to be added to the data after the shifting operation so that the audio signal of the digitalized 14-bit audio signal is instantaneously companded. At this time, the superior compression characteristics are realized throughout the entire range of the 14-bit digital data, while the SN deterioration amount is being restrained to be equal to or lower than the 14-10 near-instantaneous companding law. Since a magnitude comparator for detecting the data in the range between the (7680-8191) of the entire input range of the 14-bit digital data, and a switch for retaining the maximum value of the 12-bit digital data as the output value within the above described range may be omitted in the data compressor of the present embodiment as compared with the data compressor constructed by the conventional data companding method, the circuit scale is reduced.

A data expander using the first embodiment of the data companding method of the present invention will be described with reference to the drawings.

Figure 7:
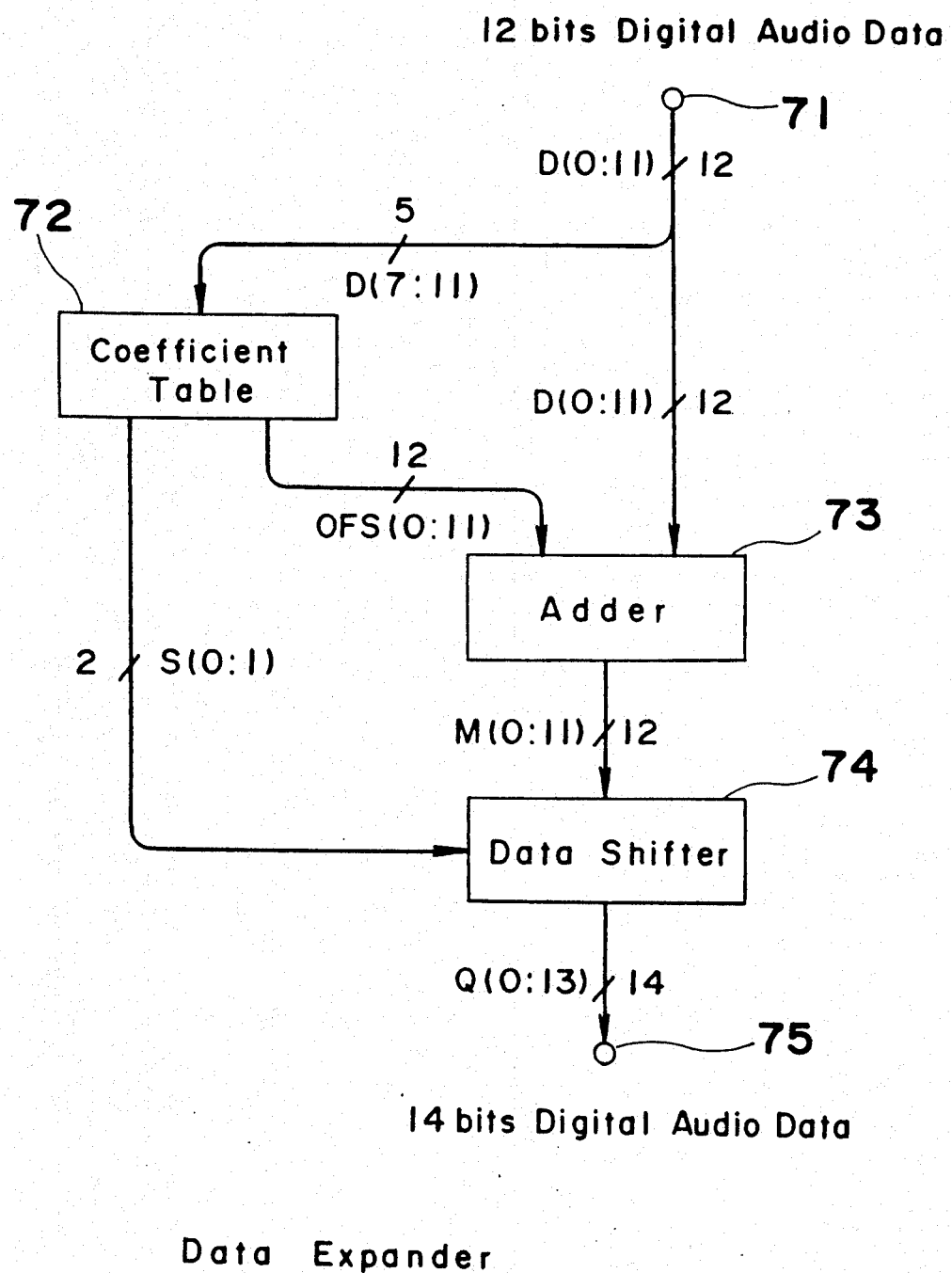
FIG. 7 is a block diagram showing the construction of the data expander.

FIG. 7 is a block diagram showing the construction in one embodiment of the data expander of the preset invention.

Referring to FIG. 7, reference numeral 71 is an input terminal of the digital data D (0:11) compressed in data into the 12 bits, reference numeral 72 is a coefficient table for decoding the 5 most significant bits D (7:11) of the D (0:11), reference numeral 73 is an adder for adding the output OFS (0:11) from the D (0:11) and the coefficient table 72, reference numeral is a data shifter composed of fourteen 4 to 1 data selectors for shifting the output M (0:11) from the adder 73 in the most significant bit direction, and reference numeral 75 is an output terminal of the digital audio signal Q (0:13) expanded in data into fourteen bits to be outputted from the data shifter 74.

The operation of the embodiment of the data expander in the present embodiment constructed as hereinabove will now be described.

The equation of the data compression into 12 bits from 14 bits shown in FIG. 3 is transformed so that the equation may be expressed as the inverse conversion equations into the data expansion as described in each region.

$$IV\ X = 8(Y - 1024) + \alpha 3$$
$$III\ X = 4(Y - 640) + \alpha 2$$
$$II\ X = 2(Y - 256) + \alpha 1$$
$$I\ X = Y$$
$$I'\ X = Y$$
$$II'\ X = Y(Y + 256) + \alpha 1$$
$$III'\ X = Y(Y + 640) + \alpha 2$$
$$IV'\ X = Y(Y + 1024) + \alpha 3$$

wherein $\alpha n$ shows a signal component with the fragments being omitted at the data compression, and is respectively the data of n bits in the binary representation.

As is clear from the above equations, the data expander of the present embodiment may be realized by the addition of the offset value with respect to the data compressed into 12 bits, and the operation of $2^n$ multiple into the addition result, namely, by the bit shift into the most significant bit direction.

The digital audio data D (0:11) compressed into 12 bits inputted into the input terminal 71 decodes the most significant five bits D (7:11) with the coefficient table 72, judges a region wherein the input data is positioned in accordance with the above described equation so as to output the offset value OFS (0:11) for adding into the D (0:11) and the bit shift amount S (0:1) into the output signal M (0:11) of the adder 73. The relationship between the S (0:1) and OFS (0:1) with respect to the D (7:11) is shown in Table 2.

TABLE 2

| D (7:11) (Binary) | S (0:1) | OFS (0:11) (Hex) |
|---|---|---|
| 01111 through 01011 | 3 | C00 H |
| 01010 through 01000 | 2 | D80 H |
| 00111 through 00100 | 1 | F00 H |
| 00011 through 11100 | 0 | 000 H |
| 11011 through 11000 | 1 | 100 H |
| 10111 through 10101 | 2 | 280 H |
| 10100 through 01000 | 3 | 400 H |

In the adder 73, the addition of the D (0:11) and OFS (0:11) is effected. By the data shifter 74 composed of fourteen 4 to 1 data selectors, the $2^n$ multiple operation of the output signal M (0:11) from the adder 73 in accordance with the value of the bit shift amount S (0:1) is effected by the bit shift in the most significant bit direction. Although in the bit shifting operation, it is desired to input some value as a value for correcting the values $\alpha 1$ through $\alpha 3$ to be removed by the data compression, the values of 100, ... or 011, ... are inputted so that the expanded data may generally become the central value in the range. It is needless to say that the other values may be inputted. The output Q (0:13) of the data shifter 74 becomes the data expanded into 14 bits, and is outputted from the output terminal 75.

As described hereinabove, the data expander of the present embodiment divides the entire range into four ranges in accordance with the amplitude range of the inputted compression 12 bit digital data by the coefficient table 72, and determines the offset value to be added into the compressed 12-bit digital audio data, and the gradient of the expansion characteristics, namely, the bit shift amount for shifting in the most significant bit direction the data after the addition of the offset value in the respective ranges, so that the superior expansion characteristics may be realized, while the SN deterioration amount is being restrained to be equal to or lower than the 14-10 near-instantaneous companding in the expansion of the instantaneously compressed 12-bit data into the 14-bit data.

Also, since the coincidence detector and the switch may be omitted in the data expander of the present embodiment as compared with the the data expander with the conventional data expanding method as in the data compressor, the circuit scale may be reduced.

Although in the description of the data compressor and the data expander of the present embodiment, the description is effected by the us of the first embodiment of the data expanding method of the present invention, the data compressor and the data expander may be made, needless to say, with the completely same construction even if the second embodiment of the data expanding method of the present invention is used. In this case, realization may be effected by the changes in the contents of the coefficient table 62 of FIG. 6 and the coefficient table 72 of FIG. 7 respectively into the values shown into Table 3 and Table 4.

TABLE 3

| D (9:13) (Binary) | S (0:1) | OFS (0:11) (Hex) |
|---|---|---|
| 01111 through 01000 | 3 | 400 H |
| 00111 through 00010 | 2 | 200 H |
| 00001 through 00001 | 1 | 100 H |
| 00000 through 11111 | 0 | 000 H |
| 11110 through 11110 | 1 | F00 H |
| 11101 through 11000 | 2 | E00 H |
| 10111 through 10000 | 3 | C00 H |

TABLE 4

| D (7:11) (Binary) | S (0:1) | OFS (0:11) (Hex) |
|---|---|---|
| 01111 through 01100 | 3 | C00 H |
| 01011 through 00110 | 2 | E00 H |
| 00101 through 00100 | 1 | F00 H |
| 00011 through 11100 | 0 | 000 H |
| 11011 through 11010 | 1 | 100 H |
| 11001 through 10100 | 2 | 200 H |
| 10011 through 10000 | 3 | 400 H |

Although the present invention has been fully described by way of example with reference to the accompanying drawings, it is to be noted here that various changes and modifications will be apparent to those skilled in the art. Therefore, unless such changes and modifications otherwise depart from the scope of the present invention, they should be construed as being included therein.

Where is claimed is:

1. A data compressor for converting a 14-bit input signal to a 12-bit output signal, the 14-bit input having bits D13, D12, ..., D1, D0, and having a numberical value range of −8192 to +8191 in decimal notation, said data compressor comprising:

a coefficient lookup table for receiving the five most significant bits D13 through D9 of the 14-bit input signal, and for outputting in accordance with a value of the thus received five most significant bits an offset value and a bit shift value;

a data shifter for receiving the 14-bit input signal and the bit shift value output by said coefficient lookup table, and for conducting a bit shift operation on the 14-bit input signal in accordance with said bit shift value, and for outputting a thus bit shifted signal; and, an adder receiving and adding the offset value output by said coefficient table and the bit shifted signal output by said data shifter, the thus added result being output as the 12-bit output signal.

2. A data compressor as recited in claim 1, wherein said coefficient lookup table has stored therein a pair of predetermined offset and a bit shift values for each of a plurality of numerical value compression ranges of the 14-bit input signal.

3. A data compressor as recited in claim 2, wherein the plurality of numerical value compression ranges comprise in decimal notation (a) a first range of −8192 to −4097, (b) a second range of −4096 to −1025, (c) a third range of −1024 to −513, (d) a fourth range of −512 to −1, (e) a fifth range of 0 to +511, (f) a sixth range of +512 to +1023, (g) a seventh range of +1024 to +4095, and (h) an eighth range of +4096 to +8191.

4. A data compressor as recited in claim 2, wherein the plurality of numerical value compression ranges comprise in decimal notation (a) a first range of −8192 to −3073, (b) a second range of −3072 to −1537, (c) a third range of −1536 to −513, (d) a fourth range of −512 to −1, (e) a fifth range of 0 to +511, (f) a sixth range of +512 to +1535, (g) a seventh range of +1536 to +3071, and (h) an eighth range of +3072 to +8191.

5. A data expander for covering a 12-bit input signal to a 14-bit output signal, the 12-bit input signal having bits D11, D12, ..., D1, D0, and having a numerical value range of −2048 to +2047 in decimal notation, said data expander comprising:

a coefficient lookup table for receiving the five most significant bits D11 through D7 of the 12-bit input signal, and for outputting in accordance with a value of the thus received five most significant bits an offset value and a bit shift value;

an adder for receiving and adding the 12-bit input signal and the offset value output by said coefficient table, and for outputting the thus added result as an added signal;

a data shifter for receiving the bit shifter value output by said coefficient table and the added signal output by said adder, and for conducting a bit shift operation on the added signal in accordance with the bit shift signal, the thus bit shifted signal being output as the 14-bit output signal.

6. A data expander as recited in claim 5, wherein said coefficient lookup table has stored therein a pair of predetermined offset and bit-shift values for each of a plurality of numerical value expansion ranges of the 12-bit input signal.

7. A data expander as recited in claim 6, wherein the plurality of numerical value expansion ranges comprise in decimal notation (a) a first range of −2048 to −1537, (b) a second range of −1536 to −769, (c) a third range of −768 to −513, (d) a fourth range of −512 to −1, (e) a fifth range of 0 to +511, (f) a sixth range of +512 to +767, (g) a seventh range of +768 to +1535, and (h) an eighth range of +1536 to +2067.

8. A data expander as recited in claim 6, wherein the plurality of numerical expansion ranges comprise in decimal notation (a) a first range of −2048 to −1409, (b) a second range of −1408 to −1025, (c) a third range of −1024 to −513, (d) a fourth range of −512 to −1, (e) a fifth range of 0 to +511, (f) a sixth range of +512 to +1023, (g) a seventh range of +1024 to 1407, and (h) an eighth range of +1408 to +2047.

* * * * *